United States Patent
Cao et al.

(10) Patent No.: US 6,530,068 B1
(45) Date of Patent: Mar. 4, 2003

(54) DEVICE MODELING AND CHARACTERIZATION STRUCTURE WITH MULTIPLEXED PADS

(75) Inventors: Huazhe Cao, San Jose, CA (US); David Michael Rogers, Sunnyvale, CA (US); Mimi Xuefeng Qian, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/366,369

(22) Filed: Aug. 3, 1999

(51) Int. Cl.[7] .................. G06F 17/50; G06F 19/00; H01L 23/62; H01L 25/03; G01R 27/00
(52) U.S. Cl. .................. 716/8; 716/5; 716/12; 702/118; 703/14; 326/47; 326/102; 257/356; 324/754; 700/109
(58) Field of Search .................. 716/1–21; 702/57–80, 702/117–120, 183–185, 189–199; 703/14–20; 326/47, 101–103; 257/213–413; 324/437, 445–450, 537, 750–769, 724, 149; 700/108–110

(56) References Cited

U.S. PATENT DOCUMENTS

| | | | | |
|---|---|---|---|---|
| 3,813,650 A | * | 5/1974 | Hunter | 438/6 |
| 4,467,340 A | * | 8/1984 | Rode et al. | 257/226 |
| 4,743,954 A | * | 5/1988 | Brown | 257/253 |
| 5,150,325 A | * | 9/1992 | Yanagisawa et al. | 365/177 |
| 5,179,539 A | * | 1/1993 | Horiguchi et al. | 365/226 |
| 5,969,987 A | * | 10/1999 | Blyth et al. | 365/185.03 |
| 6,028,758 A | * | 2/2000 | Sharpe-Geisler | 361/111 |
| 6,225,933 B1 | * | 5/2001 | Salter et al. | 341/144 |

FOREIGN PATENT DOCUMENTS

| | | | | |
|---|---|---|---|---|
| JP | 60107868 A | * | 6/1985 | H01L/29/80 |
| JP | 04171734 A | * | 6/1992 | H01L/21/338 |

OTHER PUBLICATIONS

Walton et al. ("An interconnect scheme for reducing the number of contact pads on process control chips", IEEE Transactions on Semiconductor Manufacturing, vol. 4, No. 3, Aug. 1991, pp. 233–240).*
Niewczas ("Characterisation of the threshold voltage variation: a test chip and the results", Proceedings of the IEEE International Conference on Microelectronic Test Structures, May 17, 1997, pp. 169–172).*
Walton et al. ("A novel approach for reducing the area occupied by contact pads on process control chips", Proceedings of the 1990 International Conference on Microelectronic Test Structures, Mar. 5, 1990, pp. 75–80).*

* cited by examiner

Primary Examiner—Vuthe Siek
Assistant Examiner—Phallaka Kik

(57) ABSTRACT

A multiplexed transistor characterization and modeling structure for testing a plurality of transistors, The characterization and modeling structure comprises a common substrate pad, a common source pad, a plurality of drain pads, and a plurality of gate pads. The characterization and modeling structure further comprises a plurality of individual transistors. Each individual transistor comprises a substrate connected to the common substrate pad, a source connected to the common source pad, a drain connected to a single drain pad, and a gate connected to a single gate pad, wherein each individual transistor is connected to a different drain pad and gate pad combination.

45 Claims, 4 Drawing Sheets

DEVICE MODELING AND CHARACTERIZATION STRUCTURE WITH MULTIPLEXED PADS

FIELD OF THE INVENTION

This invention relates generally to design and manufacture of semiconductors and, in particular, to transistor characterization and modeling structures.

BACKGROUND OF THE INVENTION

The design and development of semiconductors and integrated circuits is a complex and involved process requiring repeated testing and evaluation of circuit design and performance. Likewise, the fabrication of semiconductors and integrated circuits requires a high degree of precision in process control, equipment operation, and material manufacture. Throughout the design and fabrication process, various tests and measurements are made to determine the function of individual components, as well as to monitor the quality of the manufacturing process. As a consequence, transistor characterization and modeling structures are often included on the wafers along with the integrated circuits to perform many of these tests.

During the design and development stages of an integrated circuit, transistor modeling structures residing on development test chips or on Process Control Monitor test chips (PCM's) are commonly used for device modeling and transistor process characterization. For example, a particular integrated circuit may use numerous types of semiconductor devices or transistors. Each of these devices must be modeled and characterized separately to determine its functional properties and operating characteristics. Modeling of these devices is typically accomplished by fabricating a range of different device geometries (e.g., different gate lengths or source/drain channel widths) for each device on a modeling test structure. Each device geometry can then be subjected to electrical testing to determine its operational performance (i.e., transistor characterization). Analysis of the operational performance of each device geometry can then be used to develop a complete model of the operational characteristics of the device for a particular range of geometries.

One typical example of a conventional modeling structure for a MOSFET transistor (metal-oxide-silicon, field effect transistor) comprises a 46-pad test tile. One pad is used for a common gate, one pad is used for a common source, and one pad is used for a common P-substrate (for N-channel transistors). One pad is also used for a common N-well when modeling P-channel transistors (in an N-well in a P-substrate). Each of the remaining forty-two (42) pads is connected to a separate transistor drain. Accordingly, a conventional 46-pad test tile can only support forty-two (42) separate transistor geometries.

As integrated circuits become more complex, the number of devices and transistor types used in the circuit increases. The increased number of devices and transistor types require a corresponding increase in the number of modeling test structures. Similarly, as transistors become smaller and all more sophisticated, their operational characteristics become less predictable. It is therefore often necessary to test additional transistor geometries to develop an accurate and complete model of the transistor's operational characteristics. Additional test geometries also reduce the need for, and reliance on, interpolation calculations for non-tested geometries.

Modeling structures, however, are relatively large as compared to the size of the devices being tested. This is primarily the result of the test pads, which must be of sufficient size to enable contact with the testing probes. This results in certain limitations on the number of test structures that can be created or utilized on a given wafer, particularly if the wafer also contains product die. Moreover, the greater the amount of wafer space allocated to test structures, the less wafer space available for product die. There is consequently a need for a modeling structure that can incorporate and test a greater number of devices and/or device geometries.

Test structures are also required during semiconductor and integrated circuit production fabrication. Most test structures are located within the scribe lines between product die. Most of these test structures are used to monitor the process and basic device characteristics and functionality (i.e., to identify incorrectly processed material). These test structures are discarded once the product die are packaged. Scribe line monitors, for example, are destroyed when the wafer is separated into individual die.

The scribe line area between adjacent die is relatively small. Because of this constraint on wafer space, it is not unusual for a typical scribe line monitor to have very few test pads. Typical scribe line monitors are consequently very limited in their testing functions. Accordingly, there is also a need for an improved scribe line monitor that will overcome these limitations and provide a greater range of testing and device characterization functions.

BRIEF SUMMARY OF THE INVENTION

The present invention provides a multiplexed transistor modeling structure that enables testing of a plurality of transistors. The modeling structure comprises a plurality of separate transistor groups, wherein each separate transistor group comprises a plurality of individual transistors. Each individual transistor comprises a source, a drain, a substrate, and a gate. A common source pad on the modeling structure is connected to the source of each of the individual transistors. A common substrate pad is likewise connected to the substrate of each of the individual transistors.

The modeling structure further comprises a plurality of drain pads, one drain pad for each separate transistor group. Each drain pad is connected to the drains of each of the individual transistors of one transistor group. The modeling structure also comprises a plurality of gate pads, one gate pad for each of the transistors in a transistor group. Each gate pad is connected to the gate of one individual transistor in each transistor group. Consequently, each individual transistor is connected to a different gate and drain pad combination, thereby permitting each transistor to be individually tested.

The preferred embodiment of the invention includes features in addition to those listed above. Moreover, the advantages over the current art discussed above are directly applicable to the preferred embodiment, but are not exclusive. The other features and advantages of the present invention will be further understood and appreciated when considered in relation to the detailed description of the preferred embodiment.

DETAILED DESCRIPTION OF THE INVENTION

Figure 1:
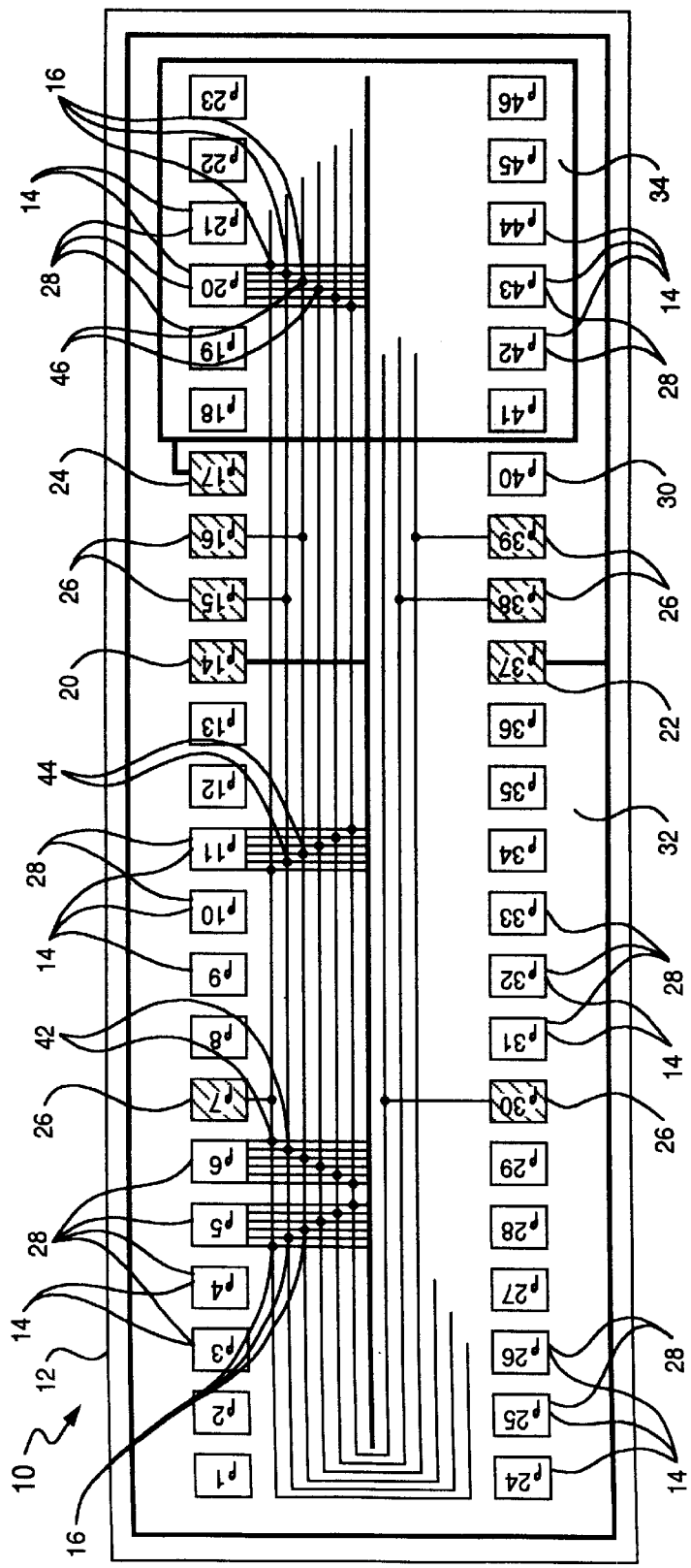
FIG. 1 is a plan view of a multiplexed transistor modeling and characterization structure of the present invention. To improve clarity, most of the test transistors have not been shown.

While the present invention will find application in all types of transistor test structures, the preferred embodiment of the invention is described in conjunction with the transistor modeling structure 10 of FIG. 1. The transistor modeling structure 10 is fabricated on a P-type silicon wafer and comprises a rectangular test tile 12 having forty-six (46) test or probe pads 14 numbered consecutively as probe pad nos. p1–p46. To improve clarity, the reference numeral to some of the probe pads 14 has been deleted from FIG. 1. The probe pads 14 are arranged in two rows near the perimeter of the test tile 12. The probe pads 14 are of sufficient size to permit a testing probe or pin (not shown) to contact the probe pads 14 during electrical parametric testing procedures. In the preferred embodiment shown, the size of each probe pad 14 is approximately 100 microns×100 microns.

As best seen in FIG. 1, the probe pads 14 are utilized as follows: A single probe pad (probe pad no. p14) is utilized as a common source pad 20. A single probe pad (probe pad no. p37) is utilized as a common substrate pad 22. A single probe pad (probe pad no. p17) is utilized as a common well pad 24 (e.g., N-well in a P-substrate). Six (6) probe pads (probe pad nos. p7, p15, p16, p30, p38, and p39) are utilized as gate pads 26. Thirty-six (36) probe pads (probe pad nos. p1–p6, p8–p13, p18–p29, p31–p36, and p41–p46) are utilized as drain pads 28. To improve clarity, the reference numeral to some of the drain pads 28 has been deleted from FIG. 1. The remaining probe pad (probe pad no. p40) is not utilized in the preferred embodiment shown.

The transistors 16 that are to be tested on the modeling structure 10 are located adjacent to each of the drain pads 28. In the preferred embodiment shown, each drain pad 28 is connected to six (6) separate transistors 16. To improve clarity, only the transistors 16 connected to drain/probe pads p5, p6, p11 and p20 have been shown in FIG. 1. As will be explained in detail below, the number of transistors 16 that can be connected to a particular drain pad 28 is limited by the number of gate pads 26 available on the modeling structure 10. In the preferred embodiment shown, there are six (6) gate pads 26. Thus, there are six (6) transistors 16 connected to each drain pad 28. The modeling structure 10 therefore includes a total of two hundred sixteen (216) transistors 16 (six (6) transistors 16 connected to each of the thirty-six (36) drain pads 28). As discussed above, only the transistors 16 connected to drain/probe pad nos. p5, p6, p11, and p20 are shown in FIG. 1.

Figure 2:
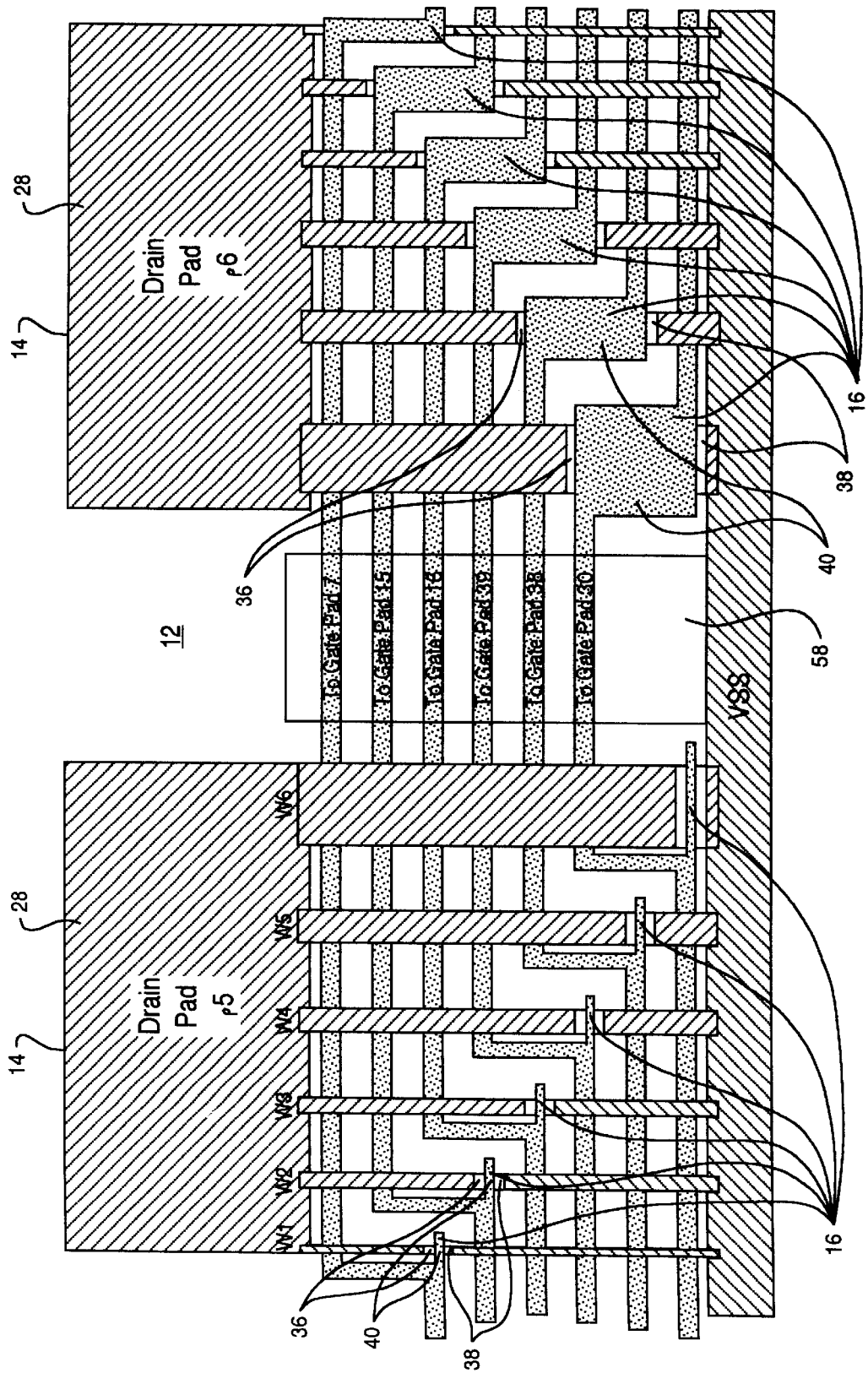
FIG. 2 is a partial view of a portion of the multiplexed modeling structure shown in FIG. 1.

As best seen in FIG. 2, the modeling structure 10 may also include a high-impedance capacitor and/or current leakage structure 58 connected between the transistor gates 40 and the gate pads 26. These structures 58 are utilized to prevent high voltages from residing on the transistor gates 40, which can ordinarily occur during device fabrication or processing. These structures 58 typically comprise a gate oxide capacitor or a diffused junction diode. Two diffused junction diodes could be connected in series and oriented such that one or the other diode will be reversed biased when positive or negative voltage is applied to the gate connection node. Structure 58 could also comprise a high impedance resistor.

In the preferred embodiment shown, all of the transistors are fabricated on a P-type silicon wafer substrate using known semiconductor manufacturing processes. Of course, the transistors can be manufactured on different types of substrates. For example, the transistors can be manufactured on a N-type silicon wafer substrate or on Germanium.

Although any number of transistor types can be modeled, the modeling structure 10 of the preferred embodiment includes three types of transistors 16 within the test tile 12. Type I transistors 42 are connected to drain/probe pad nos. p1–p6 and p24–p29. Type II transistors 44 are connected to drain/probe pad nos. p8–p13 and p31–p36. Type III transistors 46 are connected to drain/probe pad nos. p18–p23 and p41–p46. Transistor types I and II (42 and 44) are MOSFET N-channel type of transistors manufactured on a P-substrate. In the preferred embodiment shown, transistor types I and II (42 and 44) are fabricated using variations in the doping and/or implant process. Transistor type III (46) is a MOSFET P-channel type of transistor having an N-well fabricated on a P-substrate.

As is typical when modeling transistors, a multiple number of transistors of the same type (i.e., same doping and implant process) are fabricated with slightly different geometries. The differences between transistor geometries typically include small variations in the length of the transistor gate and/or the width of the source and drain channels. These variations in the transistor geometry can alter the operational characteristics of the transistor. Moreover, it is not unusual for minor changes in transistor geometry to cause anomalous results, particularly as transistors are reduced to ever-smaller sizes. As best seen in FIG. 2, each of the transistors 16 connected to a particular drain pad 28 has a slightly different geometry. The modeling structure 10 of the preferred embodiment has seventy-two (72) variations of each of the three types of transistors (42, 44, and 46) fabricated on the test tile 12 (six (6) transistor geometries connected to twelve (12) drain pads 28).

In the preferred embodiment, all of the transistors 16 connected to a single drain pad 28 have the same channel length. As will be explained in greater detail below, each of the transistors 16 are subjected to various tests. One of these tests is a measurement of the drain to source and drain to substrate breakdown voltage (commonly defined as the drain voltage at which one micro amp flows into the drain with the gate, source and substrate grounded). The connection of transistors 16 having different channel lengths to the same drain pad 28 may preclude an accurate measurement of the breakdown voltage for each of the transistors 16. In particular, it is likely that the transistor 16 having the shortest channel length will have the lowest breakdown voltage. (For MOSFET, MESFET, and JFET type transistors, channel length or gate length is typically the limiting dimension. For BJT type transistors, base width is typically the limiting dimension.) Once the breakdown voltage is reached with respect to one of the transistors 16 connected to a particular drain pad 28, it may not be possible to accurately determine the breakdown voltage for the remaining transistors 16, particularly if there is a large disparity in the transistor breakdown voltages. Each drain pad 28 is therefore only connected to transistors 16 having the same channel length. This arrangement minimizes the disparity between the breakdown voltages for the transistors 16 connected to the same drain pad 28, thereby increasing the likelihood of accurately measuring each of the transistor 16 breakdown voltages.

In the preferred embodiment shown, each of the three types of transistors (42, 44, and 46) fabricated on the test tile 12 comprise twelve (12) groups of six (6) transistors, each group having a different transistor channel length. Accordingly, there are twelve (12) channel lengths for each of the three types of transistors (42, 44, and 46) being modeled. Variations in transistor characteristics caused by differences in channel length are measured by characterizing transistors from different groups.

Of course, any combination of transistor types and geometries may be included in the modeling structure 10. For example it may be desirable to include a greater number of transistor types on the test tile 12 than the three types (42, 44, and 46) shown in the preferred embodiment. If so, then the number of transistor geometries for each transistor type may have to be reduced. Conversely, it may be desirable to model a greater number of transistor geometries. If so, then it may be necessary to reduce the types of transistors modeled to one or two per test tile.

Figure 3:
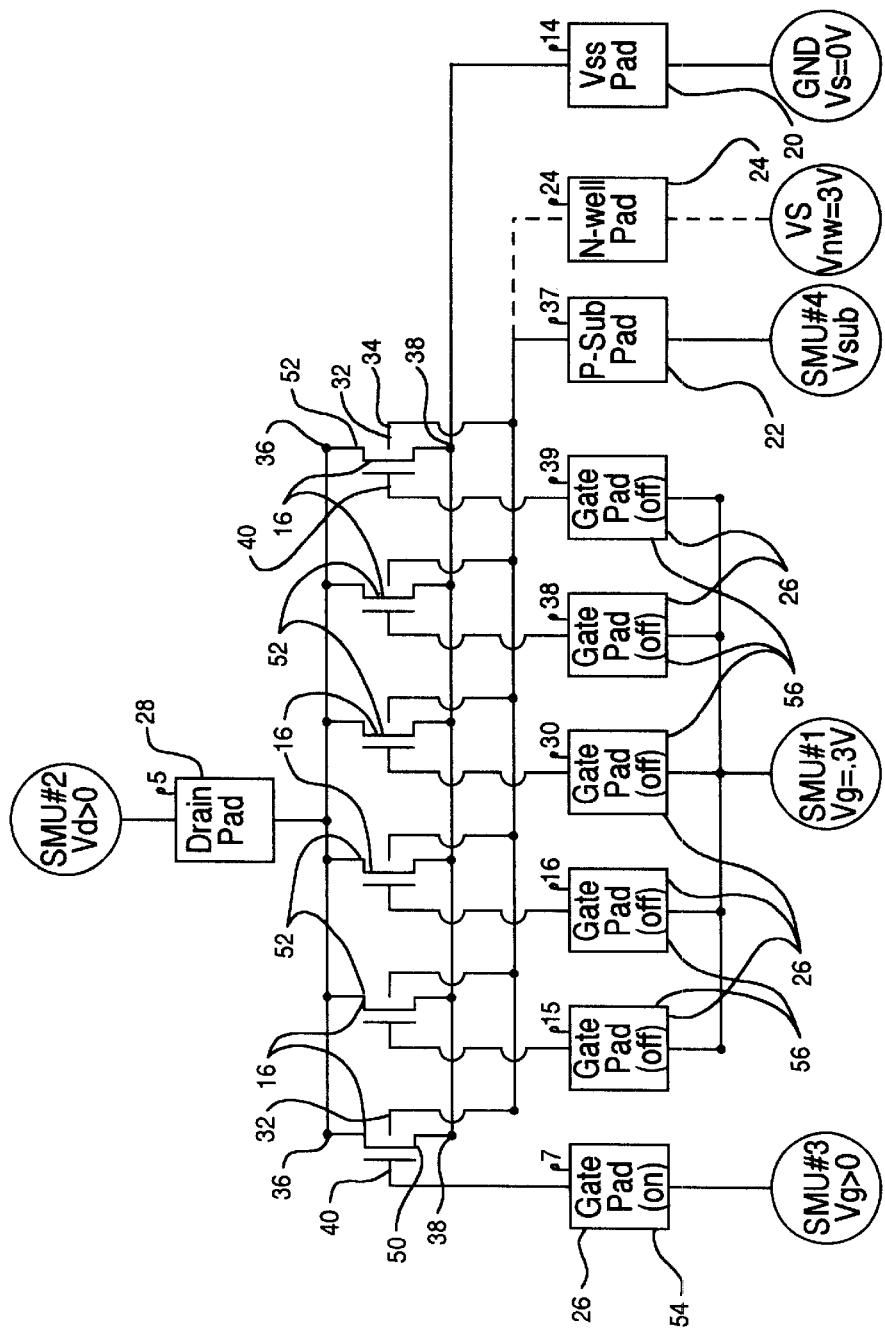
FIG. 3 is a schematic diagram of the connection and testing configuration for a single drain pad and the corresponding group of six n-channel enhancement MOSFET test transistors.

FIG. 3 is a schematic diagram of a single drain pad 28 and its connection to a group of six (6) transistors 16. The substrate 32 of each transistor 16 is connected to the common substrate pad 22. If the transistor 16 being modeled includes a well 34 within the substrate 32 (e.g., a P-channel type of transistor having an N-well in a P-substrate), then the well 34 is connected to the common well pad 24. The drain 36 of each transistor 16 is connected to the drain pad 28. The source 38 of each transistor 16 is connected to the common source pad 20. The gate 40 of each transistor 16 is connected to a separate gate pad 26. For example, and as best seen in FIGS. 1 and 2, the gates 40 of the six (6) transistors 16 connected to the drain pad 28 (e.g., drain/probe pad no. 5) are connected to gate/probe pad nos. p7, p15, p16, p30, p38, and p39, respectively. As will be explained in detail below, the multiplexed arrangement of the gate pads 26 and the drain pads 28 permits testing of individual transistors 16.

Of course, the modeling structure can utilize any combination of gate pads 26 and drain pads 28 in the above-described multiplexed arrangement. For example, in the same forty-six (46) probe pad test tile 12 described above, the extra unused probe pad 30 (probe pad no. p40) could be used as an additional gate pad 26. This would allow a total of seven (7) transistors 16 to be connected to each drain pad 28, thereby increasing the total number transistors 16 modeled to two hundred fifty-two (252). The number of transistors 16 that can be connected to a single drain pad 28 will be influenced, in large part, by space available on the test tile 12 and the geometric shape and size of the individual transistors 16 being modeled.

The characteristics of the transistors 16 being modeled on the test tile 12 are determined by subjecting the transistors 16 to various tests. In particular, the transistors 16 are measured under a number of bias conditions and temperatures. For DC type tests, a probe card is utilized to perform the testing. With respect to the forty-six (46) pad test tile 12 of the preferred embodiment, a forty-six (46) pin probe card (not shown) is used. The probe card is connected to a semiconductor parametric test system, such as an HP4026UX system (not shown), comprising a number of direct current (DC) Source/Monitor Units (SMU). The parametric test system provides a source of voltage and/or current to the probe card pins. The parametric test system can also measure the voltage or current in the probe card pins.

FIG. 3 shows an example of a MOSFET N-channel type transistor being subjected to parametric testing to measure I-V (Current-Voltage) characteristics. First, the transistor to be tested 50 is isolated from the other transistors 52 connected to the same drain pad 28. This is accomplished by applying a positive voltage to the gate pad 54 (i.e., gate/probe pad no. p7) connected to test transistor 50. In the example shown, a positive 1 volt is applied to gate pad 54. The remaining transistors 52 are "turned off" by applying a negative gate voltage to gate pads 56 (i.e., gate/probe pad nos. p15, p16, p30, p38, and p39). In the example shown, a negative 3 volts is applied to each of the gate pads 56. Next, a negative voltage is applied to common substrate pad 22 to bias the P-type substrate. A positive voltage may also be applied to the common N-well pad 24 to bias the N-well and prevent electron leakage from the N-well into the P-substrate. The common source pad 20 is then grounded. Finally, a positive voltage is applied to the drain pad 28 and the current flowing between the drain pad 28 and the common source pad 20 (i.e., through the test transistor 50) is measured.

During typical parametric testing, the voltage applied to the drain pad 28 is increased from 0 volts to an upper voltage limit (e.g., 3 volts). Current is measured for all intermediate values of voltage applied to the drain pad 28. Once this test is complete, the voltage applied to the gate pad 54 is changed to a different value, such as 2 volts, and the test is repeated. The test may be repeated for any number of gate voltages. The resulting measurements of current as a function of different combinations of voltages applied to the gate pad 54 and the drain pad 28 define the transistor I-V characteristics (i.e., transistor modeling measurement data files).

Testing of a MOSFET P-channel type transistor is performed by a similar procedure. However, the voltages applied to the drain pad 28 and the gate pads 52 and 54 are reversed. For example, a positive voltage is applied to gate pads 52 to "turn off" the non-tested transistors 52, and negative voltages are applied to gate pad 54 and drain pad 28 to induce the current through the test transistor 50.

Once testing of a particular transistor is completed, the voltages applied to the gate pads are modified so as to "turn on" a different transistor, which can then be subjected to the same parametric testing procedure described above. Likewise, parametric testing can be carried out on different groups of transistors by applying the drain voltage to different drain pads 28. Thus, activation of a particular gate pad 26 (i.e., applied positive voltage for N-channel type transistors) will permit testing of one transistor 16 connected to each of the separate drain pads 28.

Figure 4:
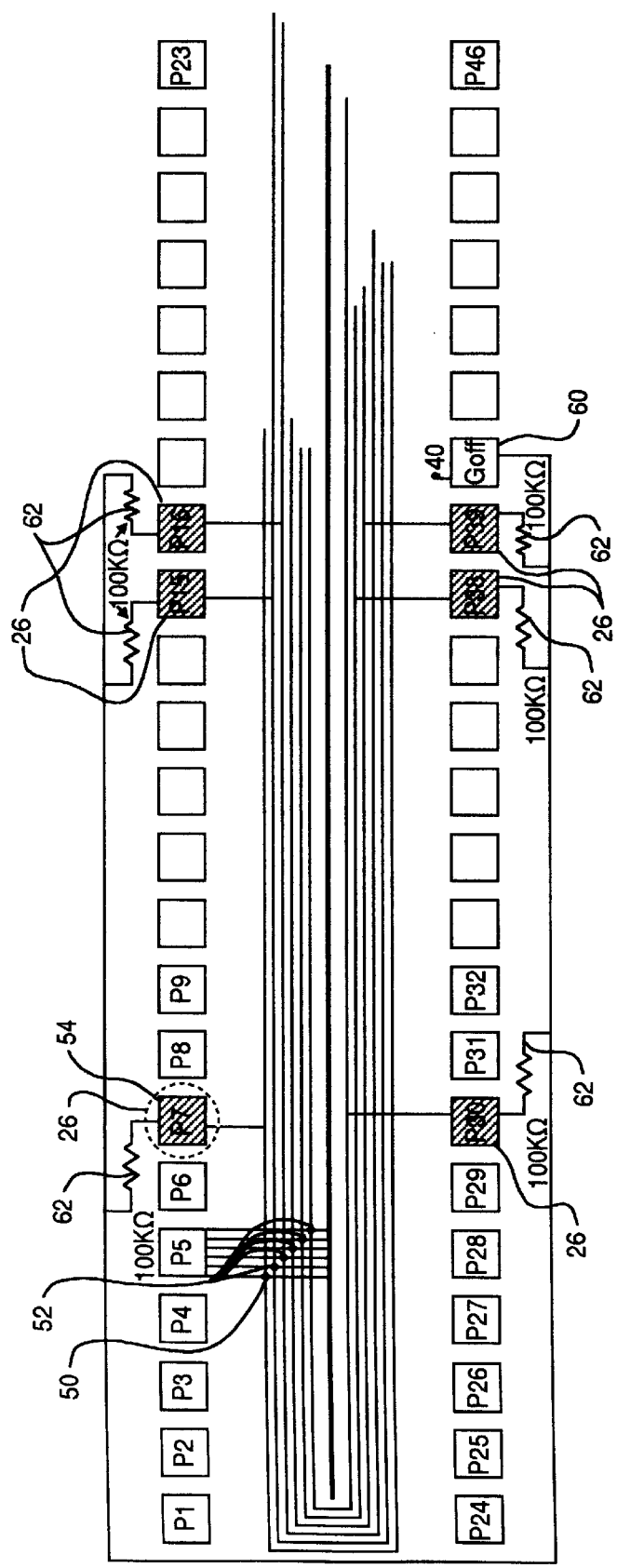
FIG. 4 is a plan view of a alternative embodiment of the multiplexed transistor modeling and characterization structure of the present invention. To improve clarity, only selected aspects of the structure have been shown.

During automatic testing with a parametric test system and a probe E-card, it is relatively easy to bias the gates 40 of the non-tested transistors 52 to voltages that will shut off all of the non-tested transistors 52. However, when a multiplexed structure is used for "bench" measurements with single probes instead of a probe card, the large number of probes needed for biasing all of the gates 40 of the non-tested transistors 52 proves cumbersome. To overcome this difficulty, and as shown in the alternative embodiment of FIG. 4, each of the gate pads 26 can be connected to a common gate shut-off pad 60. In particular, high impedance resistors (10K ohms to 100K ohms each) 62 are used to connect each gate pad 26 to the common gate shut-off pad 60 (e.g., probe pad no. p40). The high impedance resistors 62 could each comprise a diffused region (e.g., N-well, a P-well, a P-well in a N-well, a N-well in a P-well, N+, P+, LDD, etc.). The high impedance resistors 62 could also comprise one or more transistors.

To utilize this arrangement, the common gate shut-off pad 60 is biased in such a manner so as to shut off all of the non-tested transistors 52 in a particular transistor group. Although this biasing scheme would also shut off the transistor to be tested 50, this transistor could be turned back on by directly biasing the gate pad 54 of the tested transistor 50. A small current will flow from the gate pad 54 of the selected transistor to the gate shut-off pad 60. However, this small current will not effect the results of testing measurements.

The multiplexed arrangement of modeling structure 10 can be applied to other types of transistor structures, and to any other type of device or structure which can be repeatedly changed from low to high impedance by a signal on a switched node (e.g., CMOS, NMOS, MESFET, Bipolar Junction Transistors, JFET, etc.). The multiplexed arrangement can also be used on different test structures such as process development test structures, process control monitor test structures (PCM's) and scribe line monitor test structures (SLM's).

It should be appreciated that the apparatus of the present invention is capable of being incorporated in the form of a variety of embodiments, only a few of which have been illustrated and described above. For example, the multiplexed structure of the preferred embodiment can be incorporated in other test structures such as scribe line monitors. The invention may be embodied in other forms without departing from its spirit or essential characteristics. The described embodiments are to be considered in all respects only as illustrative and not restrictive, and the scope of the invention is, therefore, indicated by the appended claims rather than by the foregoing description. All modifications that come within the meaning and range of equivalency of the claims are to be embraced within their scope.

We claim:

1. A multiplexed transistor characterization and modeling structure for testing a plurality of transistors, wherein said characterization and modeling structure comprises:
    a) a plurality of separate transistor groups, wherein each separate transistor group comprises a plurality of individual transistors, further wherein each individual transistor comprises a source, a drain, a substrate, and a gate;
    b) a common source pad connected to the source of each of the individual transistors;
    c) a common substrate pad connected to the substrate of each of the individual transistors;
    d) a plurality of drain pads, wherein the number of drain pads equals or exceeds the number of separate transistor groups, further wherein each drain pad is connected to the drains of each of the individual transistors of one separate transistor group; and
    e) a plurality of gate pads, wherein the number of gate pads equals or exceeds the number of individual transistors in a transistor group, further wherein each gate pad is connected to the gate of one individual transistor in each transistor group.

2. The characterization and modeling structure of claim 1, wherein said individual transistors comprise MOSFET N-channel type transistors fabricated on a P-type silicon substrate.

3. The characterization and modeling structure of claim 1, wherein one or more of said individual transistors comprise MOSFET N-channel type of transistors fabricated on a P-type silicon substrate, and one or more of said individual transistors comprise MOSFET P-channel type transistors having a N-well in said P-type silicon substrate, further wherein said characterization and modeling structure comprises a common well pad connected to the N-well of said MOSFET P-channel type transistors.

4. The characterization and modeling structure of claim 1, wherein said common source pad, said common substrate pad, said plurality of drain pads, and said plurality of gate pads each comprise a probe pad.

5. The characterization and modeling structure of claim 4, wherein each probe pad comprises an area of approximately 100 microns×100 microns.

6. The characterization and modeling structure of claim 1, wherein an individual transistor is subjected to parametric testing by applying a voltage to one of said drain pads and to one of said gate pads.

7. The characterization and modeling structure of claim 6, wherein said parametric testing comprises measuring a current flowing through said individual transistor.

8. The characterization and modeling structure of claim 1, wherein an individual transistor is subjected to parametric testing by applying a first voltage to one of said drain pads, applying a second voltage to one of said gate pads, applying a third voltage to the remaining gate pads, applying a fourth voltage to said substrate pad, and applying a fifth voltage to said source pad.

9. The characterization and modeling structure of claim 8, wherein said second voltage is positive and said third voltage is negative.

10. The characterization and modeling structure of claim 1, wherein each of the individual transistors of one separate transistor group comprise a different physical geometry.

11. The characterization and modeling structure of claim 10, wherein each of the individual transistors of said separate transistor group comprise a similar limiting geometry, wherein said limiting geometry is a dimension of each of said individual transistors that limits the breakdown voltage of each of said individual transistors.

12. The characterization and modeling structure of claim 11, wherein each of said individual transistors comprise a channel length, said channel length being the limiting geometry for each of said individual transistors.

13. The characterization and modeling structure of claim 1, wherein each of said drain pads is connected to a common gate shut-off pad by a high impedance resistor.

14. The characterization and modeling structure of claim 13, wherein said high impedance resistor comprises a diffused region.

15. The characterization and modeling structure of claim 13, wherein said high impedance resistor comprises one or more transistors.

16. The characterization and modeling structure of claim 1, wherein said structure comprises a scribe line monitor, said scribe line monitor being located near a scribe line separating product die on a production wafer.

17. The characterization and modeling structure of claim 1, wherein said structure comprises a process control monitor test chip, said process control monitor test chip being located on a production wafer comprising a plurality of product die.

18. The characterization and modeling structure of claim 1, wherein said structure is a component of a process development test chip, said process development test chip being located on a wafer and comprising one or more characterization and modeling structures.

19. The characterization and modeling structure of claim 1, wherein a high impedance/current leakage structure is connected to the gate of each of said individual transistors.

20. The characterization and modeling structure of claim 19, wherein said high impedance/current leakage structure comprises a gate oxide capacitor.

21. The characterization and modeling structure of claim 19, wherein said high impedance/current leakage structure comprises one or more diffused junction diodes.

22. The characterization and modeling structure of claim 19, wherein said high impedance/current leakage structure comprises a resistor.

23. A multiplexed transistor characterization and modeling structure for testing a plurality of transistors, wherein said characterization and modeling structure comprises:
   a) m transistor groups, each transistor group comprising n transistors, wherein m and n are integers greater than 1, further wherein each transistor comprises a source, a drain, a substrate, and a gate;
   b) a common source pad connected to the source of each of the transistors;
   c) a common substrate pad connected to the substrate of each of the transistors;
   d) m drain pads, wherein each drain pad is connected to the drains of each of the transistors in one transistor group; and
   e) n gate pads, wherein each gate pad is connected to the gate of one transistor in each transistor group.

24. The characterization and modeling structure of claim 23, wherein m is equal to 36 and n is equal to 6.

25. The characterization and modeling structure of claim 23, wherein said transistors comprise MOSFET N-channel type transistors fabricated on a P-type silicon substrate.

26. The characterization and modeling structure of claim 23, wherein one or more of said transistors comprise MOSFET N-channel type of transistors fabricated on a P-type silicon substrate, and one or more of said transistors comprise MOSFET P-channel type transistors having an N-well in said P-type silicon substrate, further wherein said characterization and modeling structure comprises a common well pad connected to the N-well of said MOSFET P-channel type transistors.

27. The characterization and modeling structure of claim 23, wherein said common source pad, said common substrate pad, said drain pads, and said gate pads each comprise a probe pad.

28. The characterization and modeling structure of claim 23, wherein each transistor is subjected to parametric testing by applying a voltage to one of said drain pads and to one of said gate pads.

29. The characterization and modeling structure of claim 23, wherein each of the transistors of a transistor group comprise a different physical geometry.

30. The characterization and modeling structure of claim 29, wherein each of the transistors of said transistor group comprise a similar limiting geometry, wherein said limiting geometry is a dimension of each of said transistors that limits the breakdown voltage of each of said transistors.

31. The characterization and modeling structure of claim 30, wherein each of said transistors comprise a channel length, said channel length being the limiting geometry for each of said transistors.

32. A multiplexed transistor characterization and modeling structure for testing a plurality of transistors, wherein said characterization and modeling structure comprises:
   a) a common substrate pad;
   b) a common source pad;
   c) a plurality of drain pads;
   d) a plurality of gate pads; and
   e) a plurality of individual transistors, wherein each individual transistor comprises a substrate connected to the common substrate pad, a source connected to the common source pad, a drain connected to one of said drain pads, and a gate connected to one of said gate pads, further wherein each individual transistor is connected to a unique combination of drain and gate pads.

33. The characterization and modeling structure of claim 32, wherein said plurality of drain pads comprises 36 drain pads, and further wherein said plurality of gate pads comprises 6 gate pads.

34. The characterization and modeling structure of claim 32, wherein said individual transistors comprise MOSFET N-channel type transistors fabricated on a P-type silicon substrate.

35. The characterization and modeling structure of claim 32, wherein one or more of said individual transistors comprise MOSFET N-channel type of transistors fabricated on a P-type silicon substrate, and one or more of said individual transistors comprise MOSFET P-channel type transistors having an N-well in said P-type silicon substrate, further wherein said characterization and modeling structure comprises a common well pad connected to the N-well of said MOSFET P-channel type transistors.

36. The characterization and modeling structure of claim 32, wherein said common source pad, said common substrate pad, said drain pads, and said gate pads each comprise a probe pad.

37. The characterization and modeling structure of claim 32, wherein each of said individual transistors is subjected to parametric testing by applying a voltage to one of said drain pads and to one of said gate pads.

38. The characterization and modeling structure of claim 32, wherein each of the individual transistors connected to a single drain pad comprise a different physical geometry.

39. The characterization and modeling structure of claim 38, wherein each of the individual transistors connected to said single drain pad comprise a similar limiting geometry, wherein said limiting geometry is a dimension of each of said individual transistors that limits the breakdown voltage of each of said individual transistors.

40. The characterization and modeling structure of claim 39, wherein each of said individual transistors comprise a channel length, said channel length being the limiting geometry for each of said individual transistors.

41. A multiplexed transistor characterization and modeling structure for testing a plurality of transistors, wherein said characterization and modeling structure comprises:
   a) a rectangular test tile fabricated on a P-type silicon wafer, said test tile comprising a plurality of probe pads spaced near the perimeter of the test tile, wherein said plurality of probe pads comprise a substrate pad, a source pad, a group of drain pads, and a group of gate pads;
   b) a plurality of MOSFET N-channel type transistors on the test tile, wherein each transistor comprises a unique physical geometry, further wherein each transistor comprises a substrate connected to said substrate pad, a source connected to said source pad, a drain connected to one of said group of drain pads, and a gate connected to one of said group of gate pads, further wherein each transistor is connected to a different drain pad and gate pad combination.

42. The modeling structure of claim 41, wherein said group of gate pads comprises 6 probe pads.

43. The characterization and modeling structure of claim 41, wherein each transistor is subjected to parametric testing by applying a voltage to one of said drain pads and to one of said gate pads.

44. The characterization and modeling structure of claim 41, wherein each transistor connected to one of said group of drain pads comprises a similar limiting geometry, wherein said limiting geometry is a dimension of each transistor that limits the breakdown voltage of said transistor.

45. The characterization and modeling structure of claim 44, wherein each transistor comprises a channel length, said channel length being the limiting geometry for each transistor.

* * * * *